(12) United States Patent
Mkhitarian

(10) Patent No.: US 6,297,533 B1
(45) Date of Patent: Oct. 2, 2001

(54) LDMOS STRUCTURE WITH VIA GROUNDED SOURCE

(75) Inventor: Aram Mkhitarian, Glendale, CA (US)

(73) Assignee: The Whitaker Corporation, Wilmington, DE (US)

(*) Notice: Subject to any disclaimer, the term of this patent is extended or adjusted under 35 U.S.C. 154(b) by 0 days.

(21) Appl. No.: 09/070,048

(22) Filed: Apr. 30, 1998

Related U.S. Application Data

(63) Continuation-in-part of application No. 08/985,118, filed on Dec. 4, 1997, now abandoned.

(51) Int. Cl.[7] .................................................. H01L 27/088

(52) U.S. Cl. ......................... 257/336; 257/337; 257/344; 257/408; 257/901; 257/914; 257/401; 257/382; 257/383; 438/212

(58) Field of Search ...................... 257/344, 408, 257/336, 337, 901, 914, 401, 382, 383; 438/212

(56) References Cited

U.S. PATENT DOCUMENTS

| | | | |
|---|---|---|---|
| 4,873,205 | * 10/1989 | Critchlow et al. | 437/200 |
| 4,908,680 | 3/1990 | Matsuoka | 357/22 |
| 4,914,050 | * 4/1990 | Shibata | 437/38 |
| 5,155,563 | 10/1992 | Davies et al. | 357/23.4 |
| 5,252,848 | 10/1993 | Adler et al. | 257/328 |
| 5,273,922 | 12/1993 | Tsoi | 437/41 |
| 5,485,029 | * 1/1996 | Crabbé et al. | 257/501 |
| 5,548,150 | * 8/1996 | Omura et al. | 257/349 |
| 5,578,860 | 11/1996 | Costa et al. | 257/528 |
| 5,801,418 | * 9/1998 | Ranjan | 257/336 |
| 5,869,874 | * 2/1999 | Manning | 257/382 |
| 5,945,712 | * 8/1999 | Kim | 257/347 |

FOREIGN PATENT DOCUMENTS

| | | | |
|---|---|---|---|
| 2049273 | 12/1980 | (GB) | H01L/29/78 |
| 358122780 | * 7/1983 | (JP) . | |
| 358122781 | * 7/1983 | (JP) . | |
| 58-122780 | 7/1983 | (JP) | H01L/29/80 |
| 63-055960 | * 3/1988 | (JP) | H01L/21/88 |

OTHER PUBLICATIONS

Hung Chang Lin, et al., Effect of Silicon_Gate Resistance on the Frequency Response of MOS Transistors. May, 1975, Transactions of Electron Devices, vol. ED–22, No. 5, pp. 255–264.

Osamu Ishikawa and Hideya Esaki, A. High–Power High–Gain VD–MOSFET Operating at 900 MHz, IEEE Transactions on Electron Devices, vol. ED–34, No. 5, May 1987, pp., 1157–1161.

P. McGregor et al. Small–Signal High Frequency Performance Of Power MOS Transistors. vol. 27, No. 5, pp. 419–432.

(List continued on next page.)

Primary Examiner—William Mintel

(57) ABSTRACT

A lateral conduction MOS structure characterized by reduced source resistance and reduced pitch. The structure includes a semiconductor substrate having an epitaxial semiconductor layer thereon, the substrate and epitaxial layer being of the same conductivity type. The structure further includes a source layer and a drain layer, each layer being of a second conductivity type, and a channel layer disposed between the source layer and the drain layer. The channel layer has an oxide layer and a gate disposed thereon. At least one of a wet anisotropic and a reactive ion etching step is performed to define a trench having a maximum width of about from 4–6 microns and a depth that extends well into the substrate. An electrically conductive via is then formed by deposition of metal into the trench to thereby establish a low resistance path between the source and the substrate ground.

10 Claims, 4 Drawing Sheets

OTHER PUBLICATIONS

Hans J. Sigg, et al., D–MOS Transistor for Microwave Applications, IEEE Transactions on Electron Devices, Jan. 1972, pp. 45–53.

K. Ishii et al. A 900 MHz 100 W CW Mesh Emitter Type Transistor With P.H.S. Structure, 1983 IEEE, Discrete Semiconductor Division, Fujitsu Limited, Kawasaki, Japan, pp. 225–228.

Duncan Grant and Allan Tregidga, Power MOSFETs: Power for the 80s, International Rectifier Corp., El Segundo, California, Nov. 1995, pp. 11–116.

Y. Tarui et al., Diffusion Self–aligned MOST: A New Approch for High Speed Device, vol. 39, 1970, pp. 105–110.

Patent Abstract of Japan; Application No. 57005286; Application date Jan. 16, 1982.

Patent Abstract of Japan; Application No. 61198879; Application date Aug. 27, 1986.

Hirachi Y et al; "A Novel Via Hole P.H.S. Structure in K–Band Poer GAAS Fet" International Electron Devices Meeting, Washington, Dec. 7–9, 1981, Dec. 7, 1981, pp. 676–679, XP000199137, Institute of Electrical and Electronics Engineers; Abstract.

PCT International Search Report; International filing date Dec. 3, 1998, International application No.: PCT/US98/25604.

* cited by examiner

LDMOS STRUCTURE WITH VIA GROUNDED SOURCE

This application is a Continuation-In-Part of application Ser. No. 08/985,118 filed Dec. 4, 1997 now abandoned.

FIELD OF THE INVENTION

The present invention relates to a common source structure for a lateral double diffused metal oxide semiconductor field effect transistor (LDMOS FET) with a ground via to establish a common source at the device level.

BACKGROUND OF THE INVENTION

Metal oxide semiconductor field effect transistors (MOSFET) have gained a great deal of acceptance in power applications. The basic principal of the MOSFET is as follows. A source and a drain region of silicon have a first conductivity type, and a region of opposite conductivity type silicon is disposed there between. A gate metalization or polysilicon is disposed on top of the middle region of the semiconductor, with a layer of oxide disposed between the gate and the semiconductor. Current does not flow between the source and the drain under an unbiased condition, due to the potential barrier formed by the interfaces of the semiconductors. Conduction is made possible when the surface region of the channel underneath the oxide layer is inverted by the electric field resulting from an applied gate bias voltage.

Changes in the fundamental lateral structure of the device were necessitated before the MOSFET structure could compete with the current-handling capabilities of a bipolar transistor structure. The planar MOSFET proved unsuitable for power operation for a variety of reasons. A successful development of a power MOSFET was achieved with the adoption of vertical current flow through the silicon. By placing the source and drain on opposite sides of the silicon wafer, the depletion region is spread out through the silicon vertically rather than laterally thereby allowing a greater concentration of FET cells on the surface, resulting in a more efficient use of available space to enable power applications to be realized. The vertical structure metal oxide semiconductor transistors in which current flow is vertical are commonly known as VDMOS. The VDMOS structure is a double diffused structure wherein a groove is etched into the structure after successive diffusions have established the appropriate vertical diffusion profile in the silicon. A gate oxide is grown on the surface of the groove and a metal gate deposited there after on the oxide. The channel length is determined by the difference in the depths of the p and n diffusion. The VDMOS structure is an enhancement mode device which requires only a single bias polarity. Frequency limits in such a device is a function of the gate length and the saturation velocity. High frequency VDMOS structures utilize self-aligned polysilicon gates and implant/diffusion profiles to control the gate length. Finally, the VDMOS structure has a drain contact on the bottom of the die and of late has proved to have frequency response values up to a 1.0 GHz. Further understanding of the basic concepts of metal oxide structures and devices can be found in *Power MOSFETs: Power for the 80s* by Grant, et al., Solid State Technology, November 1985, the disclosure of which is specifically incorporated herein by reference.

Another structure which is being used in power MOS applications is the lateral double diffused metal oxide semiconductor FET (LDMOS FET). In the LDMOS structure, the source and drain contacts are both on the same surface of the wafer as is the gate. Accordingly, an interdigitated electrode structure is used. That is, the source, drain and gate repeat in large scale integration. The rate of repetition in spacial dimensions is known as the pitch of the device; for example the distance from the source of a first device to the source of the next device. In the device in which the substrate is nominally p-type, the subject of the disclosure of the present invention, the source is connected to the substrate, which is at ground. The LDMOS structure has a number of significant advantages when compared to the VDMOS structure. One such advantage is that the LDMOS structure enables device isolation so that multiple LDMOS devices can be fabricated on the same substrate for an integrated amplifier design, for example. The LDMOS structure has a number of significant reductions in parasitic capacitance by virtue of its structure, which translate into a comparably higher frequency response over a vertical structure. To this end, the gate-to-source capacitance $C_{gs}$ as well as the drain-to-source capacitance, $C_{ds}$ have inherently lower values when compare to the VDMOS structure. LDMOS devices have certain other advantages when compared to VDMOS structures. First of all, as alluded to above, LDMOS structures have the potential applicability in VLSI and LSI. In contrast, vertical structures such as VDMOS can not be readily fabricated in large scale. This is by virtue of the vertical nature of the device which does not lend itself to on wafer fabrication in large scale. In addition, the vertical structures have attendant practical drawback, because the source in a comparable vertical structure MOS device is not grounded, and the LDMOS source is grounded, the vertical structure device must be isolated and cannot be mounted on a common ground metalization or plane as can be done in the lateral devices. Typical isolation is done with ceramics to include beryllium oxide, which increase greatly the packaging costs of the device increase stray capacitance and have a poor ability to dissipate joule heat. In contrast, the LDMOS device can be grounded directly to a common metalization eliminating the need for the isolating ceramic, which thereby reduces the cost. Stray capacitances are not added in this structure, and the thermal dissipation of metal is clearly an advantage in power applications. Accordingly, across the industry there is an increasing trend to explore the applicability of LDMOS structures in high frequency power applications.

As stated previously, the source is connected to ground in the structure in which the substrate is p-type. This is done conventionally via a wire bond connection from the source contact to the back side metalization of the device. Such a structure, while accomplishing the required connection, has a significant drawback in the introduction of an undesired parasitic inductance. In addition to introducing an undesired inductance, particularly at higher frequencies, the wire bonding technique of the conventional design requires a greater labor input, resulting in a significant component in the overall cost of the device.

The device structure shown in FIG. 1 is this typical lateral device having the $p^{++}$ sinker. This sinker is shown at 101. The sinker overcomes the necessity to effect a wire bond between the source metalization and ground on the reverse side of the die. Typically the sinker 101 is effected through a very high doping concentration of boron. Creating a conductive path from the top of the device to the bottom of the device at the device level. In addition to effecting this contact without the need for a wire bond, the sinker at the device level has the advantage of providing a relatively low resistance path. Source resistance to ground must be maintained at a very low level in order to achieve a higher gain.

The conventional technique of using a highly concentrated sinker at the device level to achieve low ground resistance does accomplish certain advantages as stated over a wire bonding. Unfortunately, this structure has certain disadvantages. One major disadvantage of this technique of implanting a highly doped sinker, is that by the very nature of the doping process, as well as the desire to have a low resistance path, a large area is consumed. By using up valuable real estate the pitch of the device is increased. That is, as is well known to one of ordinary skill in the art, across a given amplifier, the inter-digitation of device elements is used to densely populate across a wafer. This large scale integration technique often has a source/gate/drain/gate/source, etc. sequence. The distance from the far edge of the first gate of one device and the near edge of a second gate of a second device, is known as the pitch. In order to densely populate a wafer, the pitch should be reduced as much as possible to enable more devices per unit area of the wafer. More devices per unit area of real estate translates into more power in amplifier applications. The sinker of the conventional boron doped connection between the source metalization and the substrate has an unacceptable pitch for large scale power applications. Furthermore, while the super doping to effect the sinker does provide for a somewhat acceptable source resistance, this clearly could be improved as well.

Accordingly, what is needed is a device which enables the common source configuration of a LDMOS structure which reduces the source resistance while at the same time decreases the pitch of the device.

SUMMARY OF THE INVENTION

The present invention is related to a selectively etched groove with metalization therein to effect the connection from the source to the substrate of an LDMOS device. The etched section of the wafer has a gold metalization which creates a direct short between the source and the back side of the chip. By making use of the metalization between the source and the back side of the chip, the source resistance is reduced significantly and the overall gain of the device is thereby improved.

The invention of the present disclosure is drawn to a metalized via which effects the electrical connection from the source to the grounded substrate. In the broadest sense the metalization could be a cylindrical or other shaped solid conductor (for example gold) which is connected at the top surface of the die to the source and traverses the structure down to the bottom surface of the substrate. Thereby, this via would make contact directly to the eutectic copper. Such a structure while possible, is difficult to implement. Accordingly, two embodiments are the preferred embodiments with one being no less preferred that the other. To this end, a v-groove structure which makes electrical connection by way of a metalization from the source to the grounded substrate is first embodiment. The v-groove is etched by an anisotropic wet-etch, which reveals well defined crystals and planes which serve as the surfaces for the metallization of the via. The etching technique is well known to one of ordinary skill in the art. In a second embodiment, an embodiment which reduces even further the pitch of the device, reactive ion etching (RIE) is used to etch vertically from the top surface of the die down approximately 2–3 microns and thereafter, standard wet anisotropic etching (as is done in the first embodiment) is effected in order to provide the conductive via from the source down to the grounded substrate.

The structure of the present invention enables a relatively sparing use of wafer real estate in effecting the connection of source to the back side of the chip. By virtue of the reduced area consumed, a reduction in the pitch of the device can be realized enabling a more dense population of devices per unit area on the silicon wafer. This translates directly into an increased power output in various applications. Finally, the invention of the present disclosure has clear advantages over the prior techniques through process control improvements and reliability therefrom. To this end, the doping technique used in the prior art to effect the sinker is not as precise in processing or in resultant product as is achievable by use of the present technique.

OBJECTS, FEATURES AND ADVANTAGES

It is an object of the present invention to have a lateral double diffused MOS device with a reduced source resistance and a reduced pitch in a p-type substrate device.

It is a feature of the present invention to have a conductive via between the source metalization and ground on the back side of the chip in a p-type substrate device.

It is an advantage of the present invention to have a higher packing density and higher gain when compared to other MOS structures, particularly lateral devices.

DETAILED DESCRIPTION OF THE INVENTION

As explained above, LDMOS structures are enhancement mode devices which require single polarity bias and operate as majority carrier devices. The frequency limit is generally a function of the channel length and the saturation velocity of the carriers. To increase the frequency limit $f_t$, the channel length should be short as possible. In a lateral MOSFET, the channel length is defined as the length of the gate electrode length. It depends on the photolithography technology, while in a double diffused MOSFET, the submicrometer channel can easily be formed by double diffusion from the gate edge. In order to improve the $f_t$, $C_{gs}$ and $C_{gd}$, the gate-to-source and gate-to-drain capacitances, should be minimized as much as possible. The double diffused self aligned lateral MOS structure allows for precise control of device parameters such as the channel length and the capacitances discussed above. This precise control is essential for high frequency high power devices. In order to increase the overall power of an amplifier, it is necessary to pack as densely as possible the silicon wafer with devices. This is where the pitch, s, shown in FIG. 3 plays a very important role in high-power density optimization. In summary, therefore the high frequency high power LDMOS structures utilize a self aligned polysilicon gate and implant/diffusion profile to control the gate length. Furthermore, as is discussed herein, the LDMOS structure of the present invention improves the source resistance, which has obvious ramifications on the gain of the device as well as the ability to more densely pack a given area of wafer by reduction in the pitch of the device.

Figure 2A:
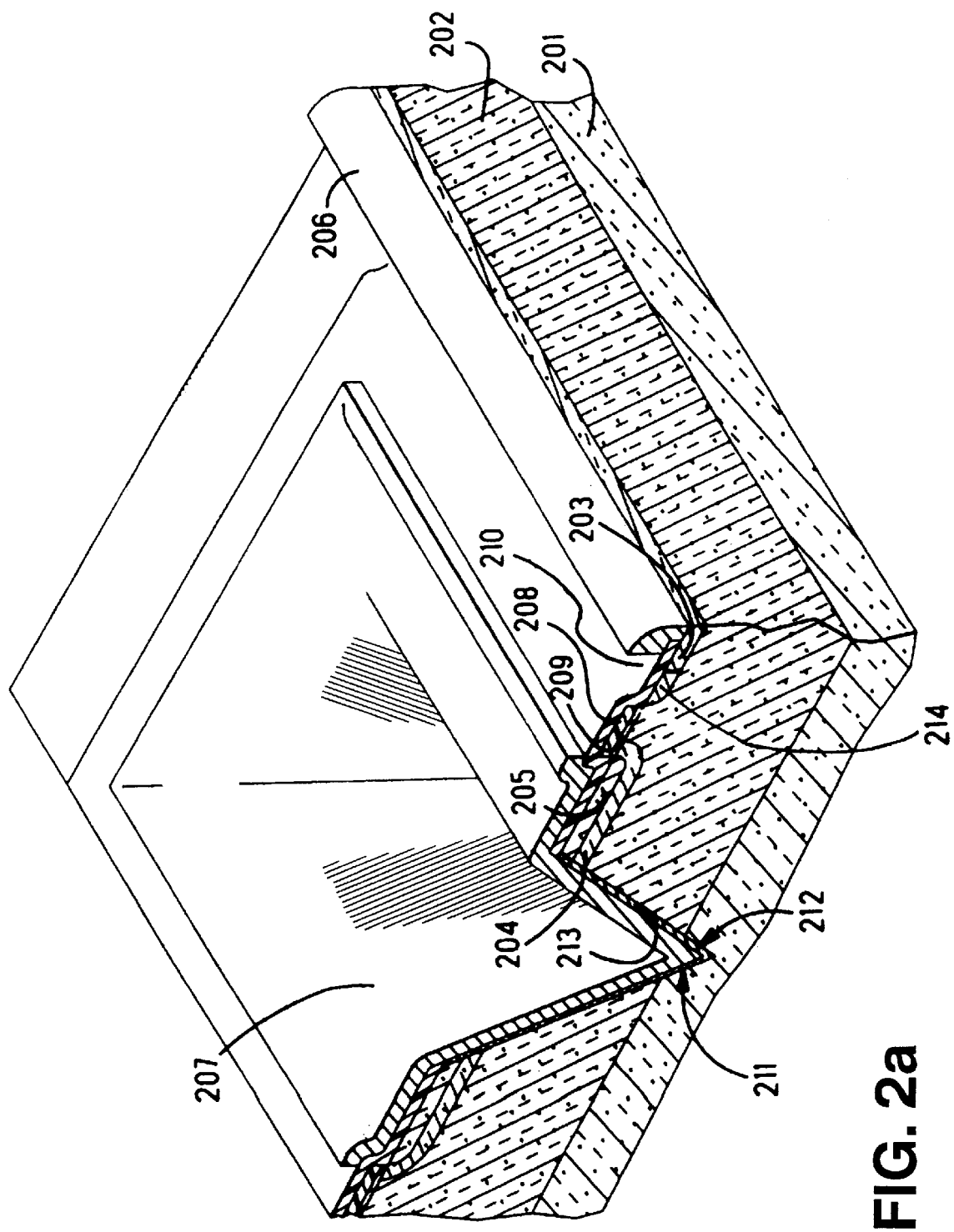
FIG. 2a is a three dimensional view (partially in cross section) of the device of a first embodiment having the v-shaped via connecting the source to the $p^{++}$ substrate.
Figure 2B:
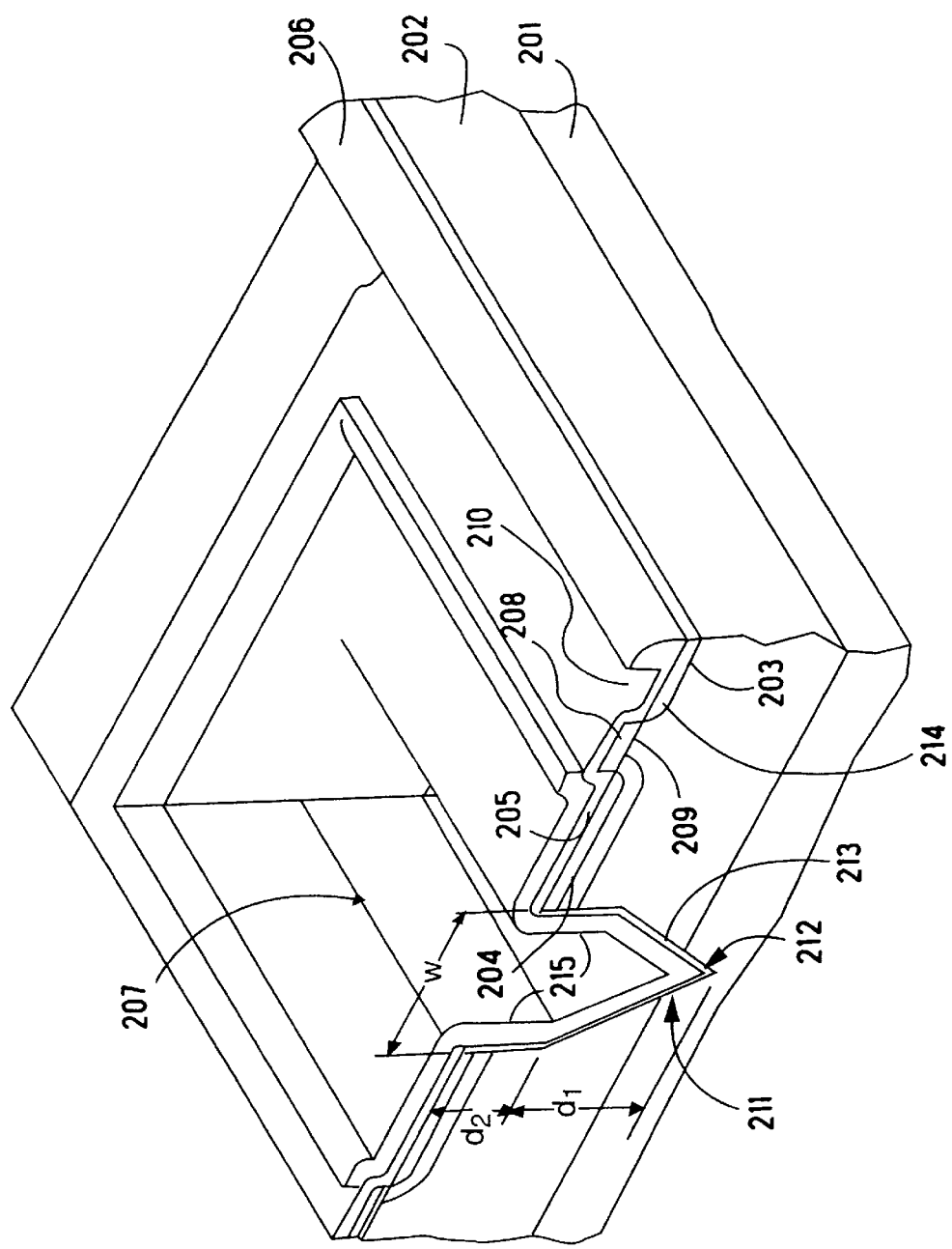
FIG. 2b is a three dimensional view (partially cross sectional view) of a second embodiment having the via which has a reduced width, with the via providing the electrical connection from the source to the $p^{++}$ substrate.

Turning to FIGS. 2a and 2b first and second embodiments of the invention of the present disclosure are shown in three dimensional cross section. The structure shown in FIG. 2a shows a first embodiment in which a via is etched from the top surface of the structure down to the substrate by techniques discussed herein. The structure shown in FIG. 2a is an anisotropic wet etch, effected by techniques well known to one of ordinary skill of the art. Alternatively, and no less preferably to the embodiment shown in FIG. 2a, the embodiment shown in FIG. 2b first makes use of a reactive ion etching to etch down vertically from the top surface of the structure approximately 2–3 microns and thereafter a wet chemical etch to reveal the v groove. The vertical walls are formed in the dry etch are shown at 215 and the v-shaped grooves are formed in the wet-etch step. The grounding of the source to the substrate is effected through the ohmic contact/metalization formed on the walls of the via. The structure shown in FIG. 2b has advantages over the structure shown in FIG. 2a in the ability to reduce the source resistance and the overall pitch of the device. The source resistance can be reduced by effecting a deeper etch into the substrate. In the embodiments of the present disclosure, the total etch depth is on the order of 10 microns. To this end, the etch into the epitaxial layer is on the order of 4 microns, and the etch into the substrate is on the order of 6 microns. Furthermore, the pitch of the structure shown in FIG. 2b can also be made to be lower than that of the structure in FIG. 2a. To this end, as is well known to one of ordinary skill in the art, the depth of the etch through wet anisotropic etching of monocrystalline material is directly proportional to the width of the opening or window in the mask used in the wet-etch. Accordingly, in order to effect a deep etch, a wider opening in the mask material on the top surface of the structure is required. The present invention, on the other hand, shown in FIG. 2b enables a deep etch without sacrificing valuable "real estate" by first effecting a reactive ion etching vertically down approximately 2–3 microns. This in effect lowers the depth of the opening used to etch the v-groove in the epitaxial material. Thereafter a wet chemical etch can be done in order to effect the required depth into the substrate for proper grounding of the source, while reducing the width of the opening for the via.

The device of the preferred embodiments of the present disclosure utilizes a $p^{++}$ substrate which is connected electrically to ground. A metalization, not shown, on the bottom surface of the substrate 201 enables a direct connection to a ground plane in a package which has the attendant advantages of both electrical and thermal contact. The $p^-$ epitaxial layer 202 is grown on the substrate 201 by standard epitaxial techniques well known to one of ordinary skill in the art. This $p^-$ layer is lightly doped in order to reduce the overall capacitance of the device, again well known to one of ordinary skill in the art. The drain diffusion 203, channel diffusion 204 and source diffusion 205 are also shown. These are effected through the double diffusion process, again which is well known to one of ordinary skill in the art. In this particular device structure, the drain and the source are doped $n^+$ to provide a low resistance path to the drain metalization 206 and the source metalization 207, respectively. The p-type channel 204 is the path of conduction when the device is on. The device as shown, when a bias is not applied, will not conduct current through the channel as this can be seen is an np junction, and does not lend itself to conduction for obvious reasons. However, the MOS structure formed by the polysilicon gate 208 and the oxide layer 209 serve as a current valve. To this end, with an application of an appropriate bias voltage, the region underneath the oxide in the p-channel is inverted, and thereby conducts the majority carriers, in this case electrons.

The $p^-$ epi layer 202 under the gate oxide 209 is also inverted and due to its light doping level enables the conduction from the channel to the drain layer. To this end, once the dopant is implanted to form the channel, both vertical and lateral diffusion are realized. The lateral diffusion defines the channel length. In the present invention, the effective channel length is defined by the doping profile, and as can be seen from FIG. 2a, the channel (p-type) under the gate oxide and polysilicon gate does not extend across the entire gate length. This effective gate length is on the order of 0.5 microns and enhances higher frequency operation. Under the gate oxide in the region between the channel and the $n^-$ high voltage diffusion layer 214, the $p^-$ layer is inverted even without the application of a bias. This is readily understood from the physics of an oxide/semiconductor junction and will not be further discussed. The $n^-$ layer 214 is necessary to improve the breakdown voltage to suitable levels for power application. Clearly, this $n^-$ layer results in greater losses than would be realized if the $n^+$ drain extended to the poly/oxide edge, but is necessary to improve $V_B$, the breakdown voltage. In summary, therefore, under zero bias, under the gate poly/oxide there is a carrier gradient by virtue of the lateral diffusion which forms the channel underneath a portion of the oxide. On application of the positive bias voltage to the gate, the carrier concentration is $n^+$ at the source, n in the channel due to inversion, n under the poly/oxide due to inversion, $n^-$ in the layer 204 and $n^+$ at the drain; thus conduction from source to drain. An oxide layer grown by plasma enhanced chemical vapor deposition (PECVD) is shown at 210 and serves as an electrical isolation means between the various contacts shown. The semiconductor fabrication of substrate epitaxial layer and double diffusion are well known to one of ordinary skill in the art. Additionally, the formation of the polysilicon gate, a gate oxide, which is $SiO_2$ and the drain metalization are also well known to one of ordinary skill in the art.

As mentioned above, there are two major advantages to be gained by virtue of the invention of the present disclosure. First, one of the important parameters of an LDMOS structure is the source resistance. The source resistance to ground must be maintained at a very low level in order to achieve higher gain. Ideally, the path from the source to the substrate ground should be as low of a resistance path as possible. The structure disclosed above which makes use of a gold or other suitable via in a column or rod shaped structure from the source to the eutectic copper would provide the lowest resistance path. Unfortunately, such a structure is difficult to implement and practice. Accordingly, the via structures shown in FIGS. 2a and 2b are attractive alternatives to the low resistance rod shaped via. The low resistance path of such a structure shown in FIGS. 2a or 2b is provided by the metalization on the inner walls of the via. It is of prime importance that the via achieve a depth as far into the substrate as possible. In would be deleterious if the via achieved the depth only into the p-epitaxial layer, which has a relatively high resistivity. By virtue of the process parameters of anisotropic etching techniques of monocrystalline materials, the suitable depth of the via is readily predicted. Accordingly, one of the main advantages of the structure in either FIG. 2a or FIG. 2b is the assurance that the via will achieve a depth far into the substrate (on the order of 6 microns) in order to effect a low resistance path to ground.

Figure 1:
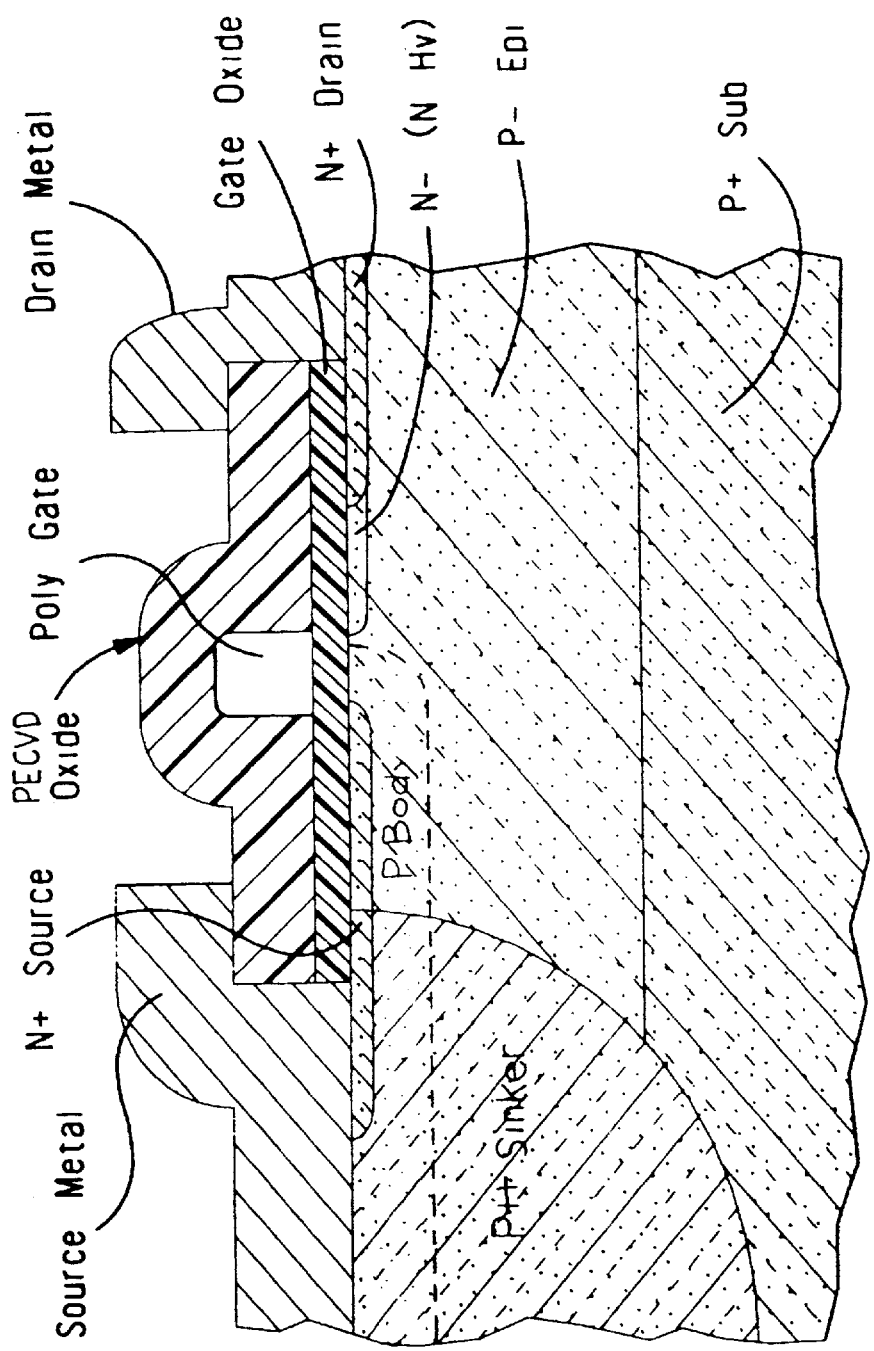
FIG. 1 is a cross sectional view of a conventional device having a $p^{++}$ sinker connecting the source to the $p^{++}$ substrate of a typical device.

The second important parameter in the power application of LDMOS field effect transistors is the pitch. As discussed herein, the ability to pack a large number of transistors into a small area is critical to the achievement of high power output. The structure shown in FIG. 2a achieves a lower pitch than the p++ sinker of the prior art shown in FIG. 1. To this end, the structure shown in FIG. 2a achieves a pitch on the order of 20–23 microns. FIG. 2b further improves the pitch of the device. To this end, the structure shown in FIG. 2b overcomes a processing limit on the depth of the via as follows. In a wet anisotropic etch of a single crystal material, the depth of the etch is directly proportional to the width of the opening in the mask. This is well known to one of ordinary skill in the art, and further details can be found for example in U.S. Pat. No. 4,210,923 to North, et al., where an approximate relation for a particular crystalline structure of silicon is given and relates the depth of the etch to the width of the opening and the mask. By virtue of the structure shown in FIG. 2b, the pitch of the device is reduced even further than that of the structure in FIG. 2a. The reduction is effected by a reactive ion etching of the die down approximately 2–3 microns vertically from the top surface (the resulting structure has side walls shown at 215). Thereafter, the anisotropic wet etching is carried out to finish the processing of the via from the region of the source down in deep into the substrate. By effectively moving the starting point of the wet-etch down 2–3 microns, the desired depth of the via well into the substrate is achieved, with the width of the opening reduced proportionally. Accordingly, a reduction in the pitch of the structure is achieved by reducing the width of the opening of the via required to achieve the desired depth.

While the structures in FIGS. 2a and 2b are the first and second embodiments of the invention of the present disclosure, it is clear that there are modifications that can be made to the processing steps which could improve both the pitch and the source resistance. By virtue of the processing steps used to effect the structure shown in FIG. 2b, a pitch on the order of 16–18 microns is achieved, which is a further reduction in the pitch even when compared to the structure of FIG. 2a but certainly when compared to the prior art p++ sinker shown in FIG. 1. Such structures which are readily apparent to one of ordinary skill in the art are deemed within the scope of the invention of the present disclosure. In either the embodiment shown in FIG. 2a or 2b, the invention focuses on the connection of the source 205 to the p++ substrate by way of the source metalization 207. This enables the low source resistance, reduced pitch device having the advantages set forth above. As stated, the connection between the source 205 and the substrate 201 connected to ground to form a commoned source arrangement is the preferred structure of the invention of the present disclosure. Clearly, as would be readily apparent to one of ordinary skill in the art, a commoned source structure is utilized in the p++ substrate arrangement.

The via of the embodiment shown in FIG. 2a is fabricated as follows. After the planar structure with the double diffusion and necessary oxide layers are fabricated, a suitable mask is fabricated through standard photolithography and etching techniques. Thereafter, a wet etch is conducted revealing the crystalline planes of the silicon which form the side walls of the v-shaped groove 211 and 212 respectively. This etching of silicon through a standard wet etch to form a v-shaped groove is well known to one of ordinary skill in the art. While this wet etch to reveal the crystalline planes of a v-groove is preferred, other techniques are possible. To this end, dry etching as well as other via shapes are within the purview of the invention. Thereafter, a layer of PtSi shown at 213 is formed through well known sintering processes to create a low resistance ohmic contact. Finally, the source metalization is fabricated through standard evaporation of metal to form the final structure as shown.

The embodiment shown in FIG. 2b is fabricated by the following steps. After the planar structure with the double diffusion in necessary oxide layers are fabricated, a suitable mask is disposed on the top surface of the die. A reactive ion etching or other suitable dry etching technique is carried out in order to etch substantially vertically down into the die approximately 2–3 microns (shown as $d_2$). This opening is on the order of 4 microns (shown as W in FIG. 2a). In contrast, the opening in the mask of the wet etched v-shaped groove in FIG. 2a is on the order of 6 microns. Once the dry etching of a depth in the order of 2–3 microns is completed, a wet chemical etching is carried out revealing the crystalline planes of the silicon which forms side walls of the v-shaped groove shown in FIG. 2b at 211 and 212. (The depth of the wet etch is shown as $d_1$ in FIG. 2b). This etching of the silicon through standard wet etch technique forms a v-shaped groove which is well known to one of ordinary skill in the art. Thereafter, a layer of Pt Si shown at 213 is formed through well known sintering processes to create a low resistance ohmic contact. Finally the source metalization is fabricated through standard evaporation of metal to form the final structure shown. The structure shown in FIG. 2b as stated previously reduces the pitch of the device to on the order of 16–18 microns. Furthermore, the structures shown in either FIG. 2a or 2b provide a low resistance path to ground from the source by assuring the depth of the via well into the substrate which has a resistivity on the order of 0.005 Ohm-cm. While the structure shown in FIGS. 2a and 2b have a differing pitch by virtue of the differing processes used to effect the vias of the respective structures, both the via of embodiment shown in FIG. 2a and the via of the embodiment shown in FIG. 2b are etched to a depth well into the substrate to assure a low resistance path. The farther into the substrate the via protrudes, the lower the ultimate resistance path is. Of course, there are tradeoffs often in the practical processing of the vias as well as potential drawbacks in pitch, and accordingly, the first and second embodiments are viable approaches to a reduction in pitch as well as a low resistance path to ground for the source. The invention of the present disclosure either in the embodiment shown in FIG. 2a or in FIG. 2b is designed to effect the desired results of the reduction in the source resistance and a reduction in the pitch.

The key performance parameters of a LDMOS device are the gain, the efficiency, the power output, and the linearity. The device of the present disclosure as discussed previously has significant improvements when compared to conventional wire bond techniques used to contact the source to ground. By eliminating the wires, no parasitic inductances are realized which improves the overall gain of the device. In addition, the device of the present disclosure has improvements when compared to the doped sinker structure of conventional techniques. This is generally manifest in the overall gain as the source resistance is reduced. The p++ sinker having the boron doping has a resistivity on the order of two orders of magnitude higher than that of the device having the Au via of the present invention. Again, this translates into an improvement in gain.

Figure 3:
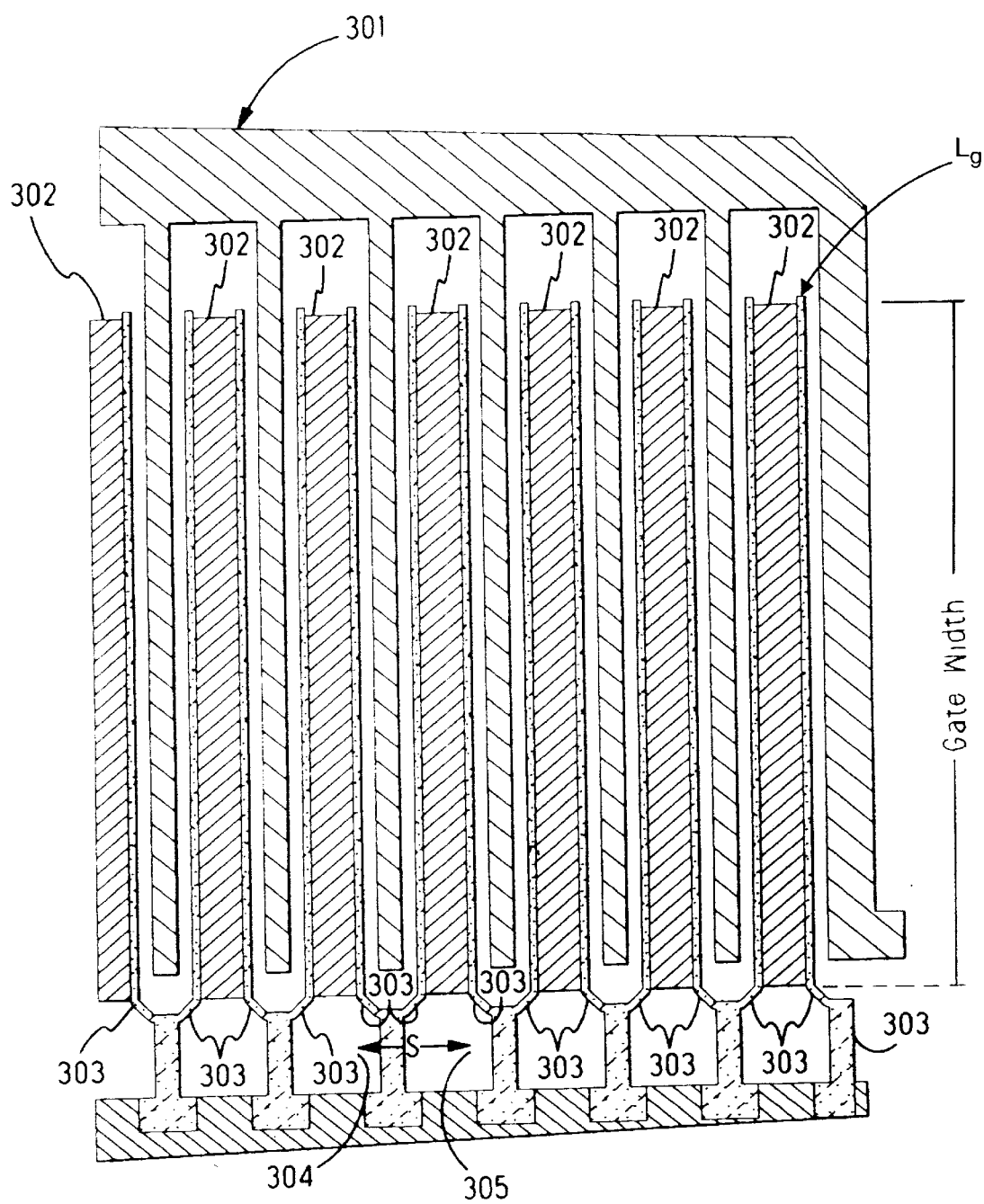
FIG. 3 is a top view showing the interdigitation of the metalizations for the source, drain and gate.

Turning to FIG. 3, the top view of a segment of interdigitated metallizations of a typical structure of the present invention, the improvements which relate to pitch can be more readily appreciated. The drain metallization is shown at 301; the source shown at 302; and the gate polysilicon layers at 303. The pitch is shown as "s" and a typical gate length, which is directly related to the channel length is shown as $L_g$; the gate width is also shown. The gate length can also be seen in cross-section in FIG. 2a. The invention of the present disclosure reduces the pitch "s" of the LDMOS devices and this improves the packing density. This increase in the packing density is beneficial, particularly in power applications for the reasons discussed herein. A very important design parameter for a MOSFET is the gate width(mm) as this impacts the number of devices per unit square of silicon, known as the packing density. As stated above the pitch of the device of the present disclosure is reduced when compared to other structures by virtue of the novel source connection. By packing more devices per unit area of silicon, the power is improved. In the device of the present disclosure the distance between the forked interdigitated polysilicon gate fingers 302 is 8–12 microns as is shown in FIG. 3. This structure enables a drain metallization to collect current from two neighboring sources using two gates through the forked design. Stated another way, the source/gate/drain/gate/source pattern has a forked gates providing the gates of the pattern. The drain of this pattern collects from two sources with the two forked gates controlled by the same signal/voltage. This pattern, well known to one of ordinary skill in the art, enables a reduction in area, and thus a reduction in parasitic capacitance.

The pitch also shown in FIG. 3 is the repetitive distance from the near edge of a first forked gate 304 to the near edge of the next forked gate 305. For the via structure shown in FIG. 2a, the distance on the order of 20–23 microns for the via structure shown in FIG. 2b, this distance is on the order of 16–18 microns as a result of the source via structure of the present invention. The gate length $L_g$ is on the order of 1.0–1.5 microns with the effective gate length defined by the lateral diffusion to form the channel being on the order of 0.5 microns. The gate width varies with the desired power level at a given frequency of operation.

In power MOSFET devices, a very important measure for design superiority is the power per unit gate width (W/mm). The power per unit gate width at a given frequency is dependent on the structure and serves as unit of comparison for devices. By reducing the pitch, the packing density increases, as can be appreciated from a review of FIG. 3, and the power per unit gate width is improved. The device of the present disclosure for the reasons stated above improves this parameter to on the order of 0.7 W/mm of gate width at 900 MHz. This value is merely exemplary and is intended to be no way limiting. The linearity and the frequency performance are also important factors in the characterization of amplifiers. The device of the present disclosure has an improved linearity on the order of 10–20% when compared to typical bipolar or other MOSFET structures. The devices using the invention of the present disclosure operate in the frequency range of 900 MHz to 2.3 GHz at power levels from 2 Watts to 90 Watt, for various power and frequency requirements. Finally, the device of the present disclosure has a gain in the range of 13–15 dB.

The invention having been described in detail, it is clear that variations and modifications will be readily apparent to one of ordinary skill in the art having had the benefit of the present disclosure. To the extent that such modifications and variations are made to the teachings of the present disclosure, a metalization via for connecting a contact on a top surface of a MOS structure to a bottom surface of the MOS structure, such is deemed within the scope of the present invention.

What is claimed is:

1. A lateral conduction MOS structure, comprising;

a semiconductor substrate of a first conductivity type having an epitaxial semiconductor layer of said first conductivity type disposed thereon, said substrate being electrically connected to ground;

a source layer and a drain layer, said source layer and said drain layer being of a second conductivity type;

a channel layer disposed between said source layer and said drain layer, said channel having an oxide layer and a gate disposed thereon;

metalization for said source layer and said drain layer on a top surface of the structure; and a conductive via for making an electrical connection from said top surface to said substrate; wherein said substrate, epitaxial semiconductor layer, source layer, and said channel layer each define an opening therein having a maximum width of less than 6 microns, and wherein said conductive via is disposed within said opening and connects said source layer to said substrate.

2. An MOS structure as set forth in claim 1, wherein said first conductivity type is p-type and said second conductivity type is n-type.

3. An MOS structure as recited in claim 1, wherein said opening is defined by a first etching step to thereby form a first opening portion having a first width and depth and by a second etching step to thereby form a second opening portion having a second width and depth, said first width being substantially constant and said first opening portion extending through said source layer, said channel layer, and at least a portion of said epitaxial semiconductor layer.

4. An MOS structure as recited in claim 1, wherein said via comprises an ohmic contact layer formed from a sintered electrically conductive material disposed over exposed portions of said substrate, epitaxial semiconductor layer, channel layer, and source layer within said opening.

5. An MOS structure as recited in claim 4, wherein said substrate is $p^{++}$, said epitaxial layer is $p^-$, said source and said drain are $n^{++}$, said channel is p-type.

6. An MOS transistor structure, comprising: an n source layer, said n source layer connected to a substrate by a first metalization; a channel layer in contact electrically with said source layer on a first side and in extending beneath a gate oxide layer on second side, said oxide having a gate disposed thereon, said gate being a near finger of a first fork, said near finger having a near edge; a drain layer having first and second sides with said first side having electrical contact with said second side of said channel; a far finger of said first fork in contact with said second side of said drain layer; a second source layer connected to said substrate by a second metalization; and a second gate having a near finger of a second fork having a near edge, said near edge of said near finger of said second fork and said near edge of said near finger of said first fork being separated by a distance S, said distance S being in the range of 20–23 microns.

7. An MOS structure as recited in claim 6, wherein said first and said second source metalizations are grooves in said structure and said substrate is connected electrically to ground.

8. An MOS transistor structure as recited in claim 7, wherein said transistor operates in a frequency range of 900 MHz to 2.3 Ghz.

9. An MOS transistor structure as recited in claim 7, wherein said transistor operates in a power range of 2 W–90 W.

10. An MOS transistor structure as recited in claim 6 wherein said substrate is p-type; said channel layer is p-type, an epitaxial layer of p⁻-type material is disposed on said substrate and said first and second drain layers are n-type at zero applied bias voltage to said gate.

* * * * *